(12) United States Patent
McKean

(10) Patent No.: US 8,329,485 B2
(45) Date of Patent: Dec. 11, 2012

(54) LED PHOSPHOR INK COMPOSITION FOR INK-JET PRINTING

(75) Inventor: Dennis McKean, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 119 days.

(21) Appl. No.: 13/103,117

(22) Filed: May 9, 2011

(65) Prior Publication Data

US 2012/0288972 A1 Nov. 15, 2012

(51) Int. Cl.
*H01L 21/00* (2006.01)
*B05D 5/06* (2006.01)

(52) U.S. Cl. .............................. 438/29; 427/64

(58) Field of Classification Search .................... 438/29; 427/64
See application file for complete search history.

(56) References Cited

U.S. PATENT DOCUMENTS

| | | | |
|---|---|---|---|
| 6,416,174 B1 * | 7/2002 | Ito et al. | 347/100 |
| 6,861,012 B2 * | 3/2005 | Gardner et al. | 252/301.36 |
| 7,179,672 B2 * | 2/2007 | Asakawa et al. | 438/29 |
| 7,476,411 B1 * | 1/2009 | Hampden-Smith et al. | 427/64 |
| 7,795,055 B2 | 9/2010 | Lee | |
| 2002/0077385 A1 * | 6/2002 | Miyabayashi | 523/160 |
| 2004/0173807 A1 | 9/2004 | Tian | |
| 2007/0024173 A1 | 2/2007 | Braune | |
| 2007/0046870 A1 * | 3/2007 | Murakami et al. | 349/117 |
| 2008/0138632 A1 * | 6/2008 | Leenders | 428/446 |
| 2010/0231487 A1 * | 9/2010 | Satoh et al. | 345/76 |

FOREIGN PATENT DOCUMENTS

| | | |
|---|---|---|
| CN | 1423680 | 6/2003 |
| CN | 101486854 | 7/2009 |
| CN | 101320772 | 6/2010 |
| WO | WO2010/127548 | 11/2010 |

* cited by examiner

*Primary Examiner* — Lex Malsawma
(74) *Attorney, Agent, or Firm* — Ella Cheong Hong Kong; Sam T. Yip

(57) ABSTRACT

The present invention provides an ink jet printable phosphor ink composition for LED packaging that enables precision control of the amount and position of phosphor layers on the LED device or the LED device packaging. The ink includes both a UV-curable resin component and a thermally curable resin component. A phase-separation component prevents phase separation of the UV-curable resin component and the thermally curable resin component. Phosphor particles on the order of less than approximately 2 microns are uniformly dispersed throughout the ink composition. The phosphor ink composition is deposited through either thermal or piezoelectric ink jet printing; a thin layer is deposited in a desired pattern. UV curing (and, optionally, thermal curing) is used to fix each layer followed by subsequent deposition and curing. In this manner, undesirable phosphor settling does not occur and layers are selectively built up to form precise phosphor distributions.

15 Claims, 1 Drawing Sheet

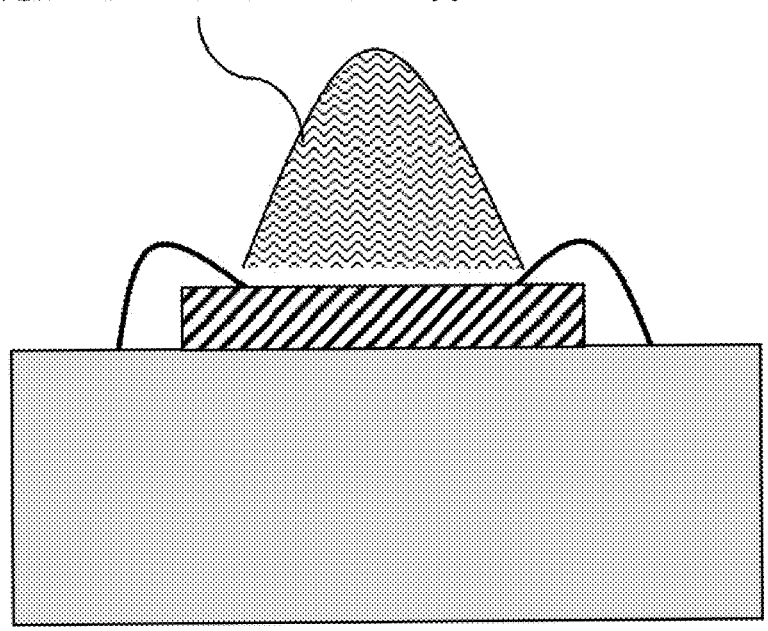

LED PHOSPHOR INK COMPOSITION FOR INK-JET PRINTING

TECHNICAL FIELD

The present invention relates generally to phosphor inks for LEDs. In particular it relates to phosphor inks for ink jet printing precision phosphor quantities on LEDs and/or LED packaging.

BACKGROUND

A light emitting diode ("LED") is a semiconductor light source. LEDs provide numerous advantages over other light sources such as incandescent lights. Amongst other advantages, LEDs typically have longer lifetimes, greater reliability, faster switching characteristics and lower energy consumption. Recent advances have produced LEDs with luminous intensities (lumen per Watt) that are comparable with or surpass incandescent lights.

LEDs produce light by the spontaneous recombination of electron and hole pairs when the LED is forward biased above the threshold voltage in an electronic circuit. The wavelength of the light produced depends upon the band gap between the materials used in the p-n junction that form the LED. The wavelength of the light produced by an LED is typically in the infra red, visible or UV ranges. Detailed information on LEDs is found in "Light emitting diodes" by E. Fred Schubert, Cambridge University Press, which is hereby incorporated in its entirety by reference. Detailed information on semiconductor optics is found in "Semiconductor optics" by Claus F. Klingshirn, Springer press, which is hereby incorporated in its entirety by reference.

For ease of manufacturing, the most common form of LED is typically on the order of a micron-sized planar square LED die disposed on a substrate. The semiconductor comprising the die is usually silicon, and the substrate may be a metal such as aluminum, which also functions as a heat sink. The LED die is electrically connected to circuitry on the substrate by fine metal wires. The LED die itself may be surface mounted on the substrate, or within a cavity on the substrate.

Various challenges exist in producing a LED with a high luminous output that is suitable for use as a light source in human environments. The first is maximizing light extraction from the planar LED die itself. As semiconductor materials have a high refractive index, a large quantity of the light produced undergoes total internal reflection (TIR) at the semiconductor-air interface. It is known in the art to reduce the amount of light that undergoes TIR by reducing the difference between the refractive indices at the semiconductor surface. As the semiconductor refractive index is a material characteristic, this is achieved by encapsulating the LED with an encapsulating material having a higher refractive index. Historically an epoxy material was used, and more recently silicone due to its comparatively higher transparency, color stability and thermal performance. Silicone, however, is relatively harder to dispense.

A single unencapsulated LED produces monochromatic light. Due to the interest in using LEDs as ambient lighting sources, in recent years research has focused on producing LED packages that emit light of different colors to that emitted by the LED die. There has been considerable interest in producing white light. The most popular way of producing white light from a single LED is by disposing a wavelength converting material, such as a yellow phosphor, on the visible (emitting) side of a blue-light emitting LED die. A layer of wavelength converting material applied on the LED die will absorb some of the emitted photons, and down-convert them into visible wavelength light, resulting in a dichromatic light source of blue and yellow wavelength light. If the yellow and blue light is produced in the correct proportions it is perceived by the human eye as a white color.

It is known in the art to add a wavelength converting material to the encapsulating layer surrounding the LED die as an alternative to depositing directly on the die. Application of the encapsulating material may be by different methods. Some methods use molding or pre-molding to fix encapsulant directly to the substrate, and some methods create and then fill a dam that encircles the LED die. The latter is usually referred to as dispensing as the encapsulating material is provided in liquid form followed by curing.

Factors affecting the color quality of the white color light are the quantity and distribution of the phosphor over the LED die. These determine the proportion of yellow wavelength light produced. When the phosphor is dispersed within the encapsulating material, process control issues can result in unintentionally uneven phosphor distribution in unpredictable patterns surrounding the LED. Current techniques for applying phosphors result in significant variability in phosphor distributions due to thickness variations in the encapsulant and uneven distribution and/or settling of phosphors during curing. Consequently, the resulting variations in device characteristics leads to sorting of devices by device characteristics ("binning"); the devices are then sold according to the device characteristics. Further, many devices are rejected as not conforming to specifications due to manufacturing issues.

Thus, there is a need in the art for precision control of phosphor distribution during LED device packaging to create more uniform color LEDs, particularly white LEDs.

SUMMARY OF THE INVENTION

The present invention provides an ink jet printable phosphor ink composition for LED packaging that enables precision control of the amount and position of phosphor layers on the LED device or the LED device packaging. The ink includes both a UV-curable resin component and a thermally curable resin component. A phase-separation component prevents phase separation of the UV-curable resin component and the thermally curable resin component. Phosphor particles on the order of less than approximately 2 microns are uniformly dispersed throughout the ink composition. To ensure ink jetting ability of the ink by ink jet printers, the ink viscosity is maintained below approximately 50 centipoise.

The ink jet printable phosphor ink composition can further include a photoinitiator for UV curing. When the thermally curable resin component is an epoxy, an epoxy curing catalyst is optionally included. In one embodiment, the UV-curable resin component is an acrylic resin optionally including hydroxyl groups for preventing phase separation of the UV-curable resin component and the thermally curable resin component. Other ink ingredients can include a humectant, one or more solvents (one of which may be water), a biocide, and a surfactant.

Due to the unique nature of the phosphor inks of the present invention, the phosphor amount and distribution can be precisely controlled through ink jet printing. The phosphor ink composition is deposited through either thermal or piezoelectric ink jet printing either directly on an LED die or on an LED package such as a silicone or epoxy package. A layer approximately 5 microns thick is deposited in a desired pattern. UV curing is used to fix the layer, with optional thermal curing, followed by subsequent deposition and curing. Alternatively, thermal curing is performed following deposition of all the phosphor layers. In this manner, the phosphor particle positions are fixed in each layer, preventing undesirable phosphor settling. The layers are selectively built up to form precise amounts of phosphors across the LED or LED package.

BRIEF DESCRIPTION OF THE DRAWINGS

FIG. 1 depicts the Lambertian emission characteristics of a typical LED.

DETAILED DESCRIPTION

The inks according to the present invention are described below with respect to formation of a "white" LED using a combination of a blue LED packaged with yellow phosphors. However, it is understood that the present invention is applicable to the application of any phosphor to any color LED in order to tailor the color of LED as perceived by the human eye. As used herein, the term "phosphor" is used broadly to describe any wavelength converting materials that absorb light at one wavelength and emit light at another wavelength, whether or not they are considered "phosphors" in the traditional sense of the term.... For blue LEDs, typical phosphors used for emitting yellow light include yttrium aluminum garnet (YAG)-based materials (optionally doped with cerium), terbium aluminum garnet (TAG)-based materials, and silicate-based, sulfur-based, nitrogen-based, or nitrogen oxide based materials. Organic phosphors can also be used as well as organic and inorganic non-phosphor-based wavelength converting materials—which, for simplicity, are termed "phosphors" as set forth above. A single wavelength converting material or a combination of wavelength converting materials can be selected depending upon the overall desired emission from the packaged LED.

The ink jet printable phosphor inks of the present invention advantageously use a polymer binder that is a combination of a UV-curable resin and a thermally curable resin. The UV-curable resin and the thermally curable resin must have high transparency in the visible spectrum (approximately 390 to 750 nm). In an exemplary embodiment, the UV-curable resin is an acrylic resin, preferably including hydroxyl groups to prevent phase separation between the UV-curable resin and the thermally curable resin. To enhance UV curing, an optional photoinitiator is included. The thermally curable resin can be selected from epoxy resins, optionally including an epoxy cure catalyst in the ink composition.

To prevent drying of the phosphor ink within the inkjet nozzles, an optional humectant is provided. For aqueous ink compositions, water and cosolvents are provided in amounts sufficient to control the overall phosphor ink viscosity. Typically, the cosolvents are selected from water miscible organic cosolvents to ensure complete dissolution of the polymer binder components in the ink composition. For ink jet printing, viscosity should be maintained below about 50 centipoise. For thermal ink jet printing, a range of approximately 2 centipoise to 6 centipoise is preferred. Surface tension for ink jet printing is preferably in the range of about 30-50 dyne/cm. Other ink ingredients such as one or more biocides and/or surfactants are optionally provided to aid in ink preservation and ink wetting properties and to control surface tension properties.

Due to the unique nature of the phosphor inks of the present invention, the phosphor amount and distribution can be precisely controlled through ink jet printing. The phosphor ink composition is deposited through either thermal or piezoelectric ink jet printing either directly on an LED die or on an LED package such as a silicone or epoxy package. A layer approximately 5 microns thick is deposited in a desired pattern. The pattern may be either continuous or discontinuous depending on the phosphor layer design characteristics (that is, the phosphor inks may be deliberately deposited in a non-uniform pattern to overcome the variance in emission characteristics of the LED—see discussion below). UV curing and, optionally, thermal curing are used to fix each layer followed by subsequent deposition and curing. Alternatively, thermal curing can be performed following deposition of all the phosphor layers. In this manner, undesirable phosphor settling does not occur (as the phosphors within each layer are quickly fixed in position following deposition) and the layers are selectively built up to form precise amounts of phosphors across the LED or LED package. Typically, a total thickness is approximately 25-30 microns is selected with 5-6 sequential depositions. However, in areas where a greater concentration of phosphor is desired, more layers may be deposited; similarly, in those areas requiring a lower concentration of phosphors, fewer layers may be deposited. Alternatively, different regions of the LED or LED package can use inks having different concentrations of phosphor(s), different phosphor compositions, or different mixtures of phosphors to customize the lighting characteristics. Approximately 50% of the as-deposited thickness is lost during drying while an approximately 10% shrinkage due to curing will occur.

By depositing and curing the phosphor inks in layers, undesirable phosphor particle settling is avoided and unique patterns and phosphor distribution layers can by custom created. For example, planar LEDs have a Lambertian emission pattern, as shown in FIG. 1. In other words, the radiant intensity is directly proportional to the cosine of the angle between the observer's position and the surface normal. Consequently, the apparent radiance of the emitted light to an observer appears the same from all positions. The encapsulating material used to reduce TIR can also act as a lens and narrow the light beam emitted. Various shapes of encapsulating material have been used and it is known in the art to use a hemispherical shaped encapsulant material to maximize the light extraction efficiency from a planar LED die.

Some of the light that does escape is absorbed or reflected by the surrounding substrate material, especially when the LED die is located within a cavity. As a result, the light from the packaged LED may have a yellow "ring" away from the central beam axis. This arises from the Lambertian emission profile of the LED and/or phosphor particle settling: there are too few phosphor particles on the center of the LED die to emit enough yellow light relative to the amount of blue light emitted, whilst towards the LED die sides there are too many phosphor particles relative to the amount of blue light emitted, and hence over stimulated to emit yellow light. Use of the ink jet printing techniques of the present invention can overcome this problem by proportionally distributing the phosphors in such a manner as to create an even appearance of white light throughout the distribution. In particular, a greater concentration of phosphors should be situated at the regions of greatest emission while a lesser concentration of phosphors should be situation at the regions of lower emission (generally the edge regions). Alternatively, as discussed above, different phosphors/concentrations of phosphors/ combinations of phosphors can be used to create the desired overall emission characteristics.

EXAMPLE 1

Example 1 presents phosphor ink compositions according to the present invention.

| Material class | Examples | Composition Range (weight %) |
|---|---|---|
| Phosphor | YAG: Ce, SrBaSiEu, CaS: Eu, YAG: Tb, SrS: Eu, SrGa$_2$S$_4$: Eu | 3-18 |
| Hydroxy-functional acrylic monomer | Glycerol 1,3-diglycerolate diacrylate, Sartomer CN132, CN120, CN133 | 1-15 |
| Photoinitiator | Irgacure 819DW, 2959 | 0.05-1.0 |
| Epoxy Cure Cat. | King Industries CXC1615, 1735, 1612 | 0.05-1.0 |
| Epoxy monomer | Glycerol triglycidylether | 2-15 |
| Humectants | Glycerol, Dipropylene glycol, diethylene glycol, ethylene glycol | 10-30 |
| Cosolvents | Gamma-Butyrolactone, N-Methylpyrrolidone, N-vinylpyrrolidinone*, n-vinyl caprolactam*, n-vinylacetamide* | 10-30 |
| Biocide | Proxel GXC | 0.1-1.0 |
| Surfactants | Silwet 7001, 7230, 7605 | 0.05-3 |
| Water | | 30-80 |

*Reactive diluents

While the foregoing invention has been described in terms of the above exemplary embodiments, it is understood that various modifications and variations are possible. Accordingly, such modifications and variations are within the scope of the invention as set forth in the following claims.

The invention claimed is:

1. An ink jet printable phosphor ink composition for deposition on an LED device or LED device packaging comprising:
    a UV-curable resin component;
    a thermally curable resin component;
    a phase-separation component for preventing phase separation of the UV-curable resin component and the thermally curable resin component;
    phosphor particles on the order of less than approximately 2 microns uniformly dispersed throughout the ink composition, the ink composition having a viscosity less than approximately 50 centipoise such that the ink is configured for printing by an ink jet printer.

2. An ink jet printable phosphor ink composition according to claim 1 further comprising a photoinitiator for UV curing.

3. An ink jet printable phosphor ink composition according to claim 1 wherein the thermally curable resin component is an epoxy.

4. An ink jet printable phosphor ink composition according to claim 3 further comprising an epoxy curing catalyst.

5. An ink jet printable phosphor ink composition according to claim 1 wherein the UV-curable resin component is an acrylic resin.

6. An ink jet printable phosphor ink composition according to claim 5 wherein the acrylic resin includes acrylic monomers including hydroxyl groups for preventing phase separation of the UV-curable resin component and the thermally curable resin component.

7. An ink jet printable phosphor ink composition according to claim 1 further comprising a humectant, one or more solvents, a biocide, and a surfactant.

8. An ink jet printable phosphor ink composition according to claim 1 further comprising water miscible organic cosolvents to ensure complete dissolution of the resin components in the ink composition.

9. An ink jet printable phosphor ink composition according to claim 1 wherein the phosphor is an organic phosphor or an inorganic phosphor in an amount from approximately 3 weight percent to approximately 18 weight percent.

10. An ink jet printable phosphor ink composition according to claim 1 wherein the phosphor is selected from YAG:Ce, SrBaSiEu, CaS:Eu, YAG:Tb, SrS:Eu, or SrGa$_2$S$_4$:Eu.

11. An ink jet printable phosphor ink composition according to claim 1 wherein the UV curable resin component is present in an amount from approximately 1 weight percent to approximately 15 weight percent.

12. An ink jet printable phosphor ink composition according to claim 1 wherein the thermally curable resin component is present in an amount from approximately 2 weight percent to approximately 15 weight percent.

13. A method for forming a phosphor layer on an LED or an LED package comprising:
    ink jetting a layer of the phosphor ink of claim 1 on an LED die or on an LED package;
    at least UV curing the phosphor ink layer;
    forming repeated layers of the phosphor ink of claim 1 by ink jetting followed by UV curing until a desired phosphor ink layer thickness is formed.

14. A method according to claim 13 further comprising thermally curing each phosphor ink layer following deposition.

15. A method according to claim 13 further comprising thermally curing all of the phosphor ink layers at once following deposition.

* * * * *